US012745346B2

(12) United States Patent
Hishinuma et al.

(10) Patent No.: US 12,745,346 B2
(45) Date of Patent: Sep. 22, 2026

(54) STRETCHABLE DEVICE

(71) Applicant: Magnolia White Corporation, Tokyo (JP)

(72) Inventors: Masatomo Hishinuma, Tokyo (JP); Takumi Sano, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 182 days.

(21) Appl. No.: 18/825,321

(22) Filed: Sep. 5, 2024

(65) Prior Publication Data

US 2025/0089157 A1 Mar. 13, 2025

(30) Foreign Application Priority Data

Sep. 7, 2023 (JP) ................................ 2023-145429

(51) Int. Cl.
*H05K 1/02* (2006.01)

(52) U.S. Cl.
CPC ................................. *H05K 1/0283* (2013.01)

(58) Field of Classification Search
CPC .................................................. H05K 2/0283
USPC ........................................................ 174/254
See application file for complete search history.

(56) References Cited

U.S. PATENT DOCUMENTS

2010/0330338 A1* 12/2010 Boyce ..................... B29C 59/02 428/156
2014/0055702 A1* 2/2014 Park ..................... H10D 86/441 257/40
2015/0173186 A1* 6/2015 Na ....................... H05K 1/0283 29/850
2016/0268352 A1* 9/2016 Hong ................... H10K 59/353
2022/0087010 A1* 3/2022 Sano .................... H05K 1/0283

FOREIGN PATENT DOCUMENTS

CN 103519427 B * 2/2015 ............. A41D 31/28
JP 2020202208 A 12/2020

* cited by examiner

*Primary Examiner* — Stanley Tso
(74) *Attorney, Agent, or Firm* — Maier & Maier, PLLC

(57) ABSTRACT

According to an aspect, a stretchable device includes: a resin base member including a plurality of bodies disposed apart from each other and a plurality of hinges that couple the bodies to each other; and an array layer provided on the resin base member. The array layer includes a plurality of wiring lines extending along the hinges and spaced apart from each other in a width direction of the hinges. Each of the hinges has a plurality of bends bending when viewed in a stacking direction in which the resin base member and the array layer are stacked. Each of the bends has at least one or more slits that are formed between the wiring lines when viewed in the stacking direction and that divide the bend in the width direction.

4 Claims, 9 Drawing Sheets

100
8
30
10
61
60
11
9
73
11
9
73
1
2
71
11
9
70
73
11
9
73
11
Z1
Z2
72
72a 61
60
70
9
30
22, 22c
33
O33, O43
43
L2
28
42
O12, O32, O42
32
22, 22b
L1
28
41
O31, O41
31
22, 22a
2
9
1
Z1
Z2

61
60
70
9
30
22, 22c
33
43
28
42
32
22, 22b
28
41
31
22, 22a
2
9
1
Z1
Z2

STRETCHABLE DEVICE

CROSS-REFERENCE TO RELATED APPLICATION

This application claims the benefit of priority from Japanese Patent Application No. 2023-145429 filed on Sep. 7, 2023, the entire contents of which are incorporated herein by reference.

BACKGROUND

1. Technical Field

What is disclosed herein relates to a stretchable device.

2. Description of the Related Art

Stretchable devices include a stretchable substrate with excellent elasticity and flexibility. As described in Japanese Patent Application Laid-open Publication No. 2020-202208, the stretchable substrate includes a resin base member and an array layer provided on the resin base member. The resin base member includes bodies arrayed in a matrix (row-column configuration) and hinges that couple the bodies to each other. The hinge has arc-shaped bends, for example, and meanders and extends between the bodies.

To detect a load or force acting on the stretchable device, the array layer is provided with an electrical circuit and a plurality of wiring lines. The wiring lines are disposed over a plurality of hinges and a plurality of bodies. Therefore, the wiring lines extend in a planar direction parallel to the stretchable device.

When the stretchable device is stretched or shrunk, the bend deforms, and strain is generated in the bend. The strain increases from the center of the bend toward the outer periphery or the inner periphery of the bend in the width direction. For this reason, the wiring lines are preferably disposed overlapping the center of the bend in the width direction. However, the number of wiring lines disposed at the center of the bend in the width direction is limited to one. If there are two or more wiring lines, at least one of them is disposed at a part other than the center of the bend in the width direction. As a result, the wiring line is subjected to more strain and may possibly be broken.

For the foregoing reasons, there is a need for a stretchable device having two or more wiring lines that are disposed on hinges and hard to break.

SUMMARY

According to an aspect, a stretchable device includes: a resin base member including a plurality of bodies disposed apart from each other and a plurality of hinges that couple the bodies to each other; and an array layer provided on the resin base member. The array layer includes a plurality of wiring lines extending along the hinges and spaced apart from each other in a width direction of the hinges. Each of the hinges has a plurality of bends bending when viewed in a stacking direction in which the resin base member and the array layer are stacked. Each of the bends has at least one or more slits that are formed between the wiring lines when viewed in the stacking direction and that divide the bend in the width direction.

DETAILED DESCRIPTION

Figure 1:
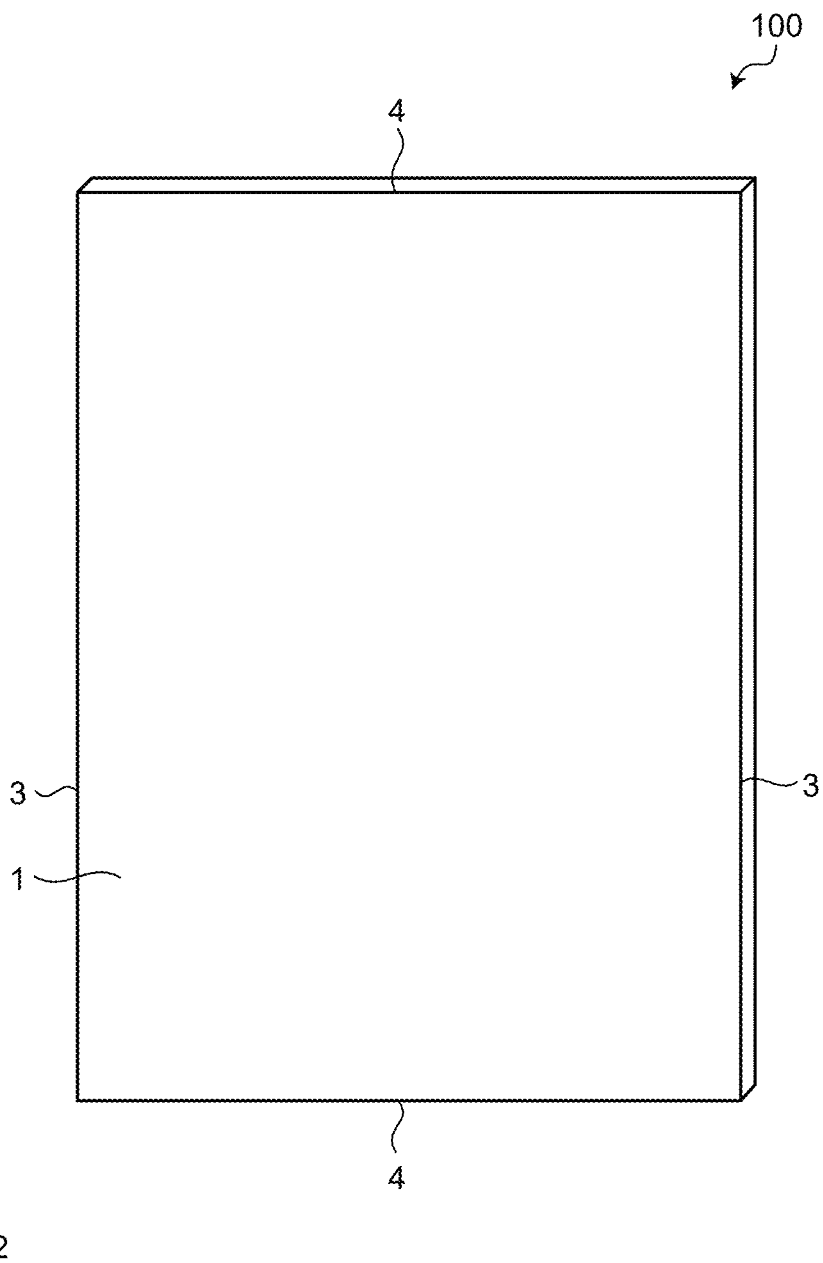
FIG. 1 is a perspective view of a stretchable device according to a first embodiment when viewed from a front surface.
Figure 1:
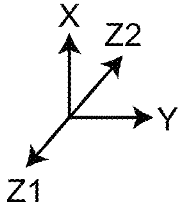

Exemplary aspects (embodiments) to embody the present disclosure are described below in greater detail with reference to the accompanying drawings. The contents described in the embodiments below are not intended to limit the disclosure according to the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by the same reference numerals, and detailed explanation thereof may be appropriately omitted.

When the term “on” is used to describe an aspect where a first structure is disposed on or above a second structure in the present specification and the claims, it includes both of the following cases unless otherwise noted: a case where the first structure is disposed on and in contact with the second structure, and a case where the first structure is disposed above the second structure with still another structure interposed therebetween.

First Embodiment

FIG. 1 is a perspective view of a stretchable device according to a first embodiment when viewed from a front surface. As illustrated in FIG. 1, a stretchable device 100 has a flat plate shape. The stretchable device 100 has a front surface 1 and a back surface 2 (not illustrated in FIG. 1, and refer to FIG. 2) facing opposite to each other. In the following description, the direction parallel to the front surface 1 and the back surface 2 is referred to as a planar direction.

The stretchable device 100 has a rectangular (quadrilateral) shape when viewed from a side facing the front surface 1. Therefore, the front surface 1 has a pair of long sides 3 and a pair of short sides 4. In the following description, a direction parallel to the planar direction and to the long side 3 is referred to as a first direction X, and a direction parallel to the short side 4 is referred to as a second direction Y. A direction parallel to the front surface 1 is referred to as the planar direction.

Figure 2:
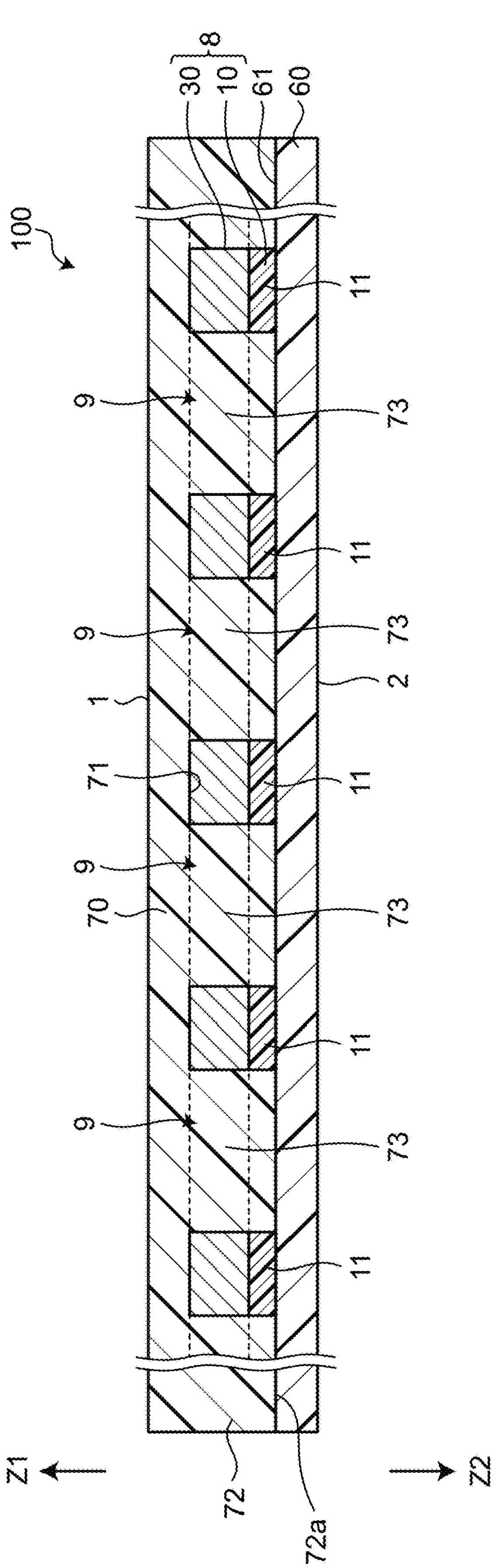
FIG. 2 is a schematic of a section of the stretchable device according to the first embodiment, and more specifically a sectional view along line II-II of FIG. 3.
Figure 3:
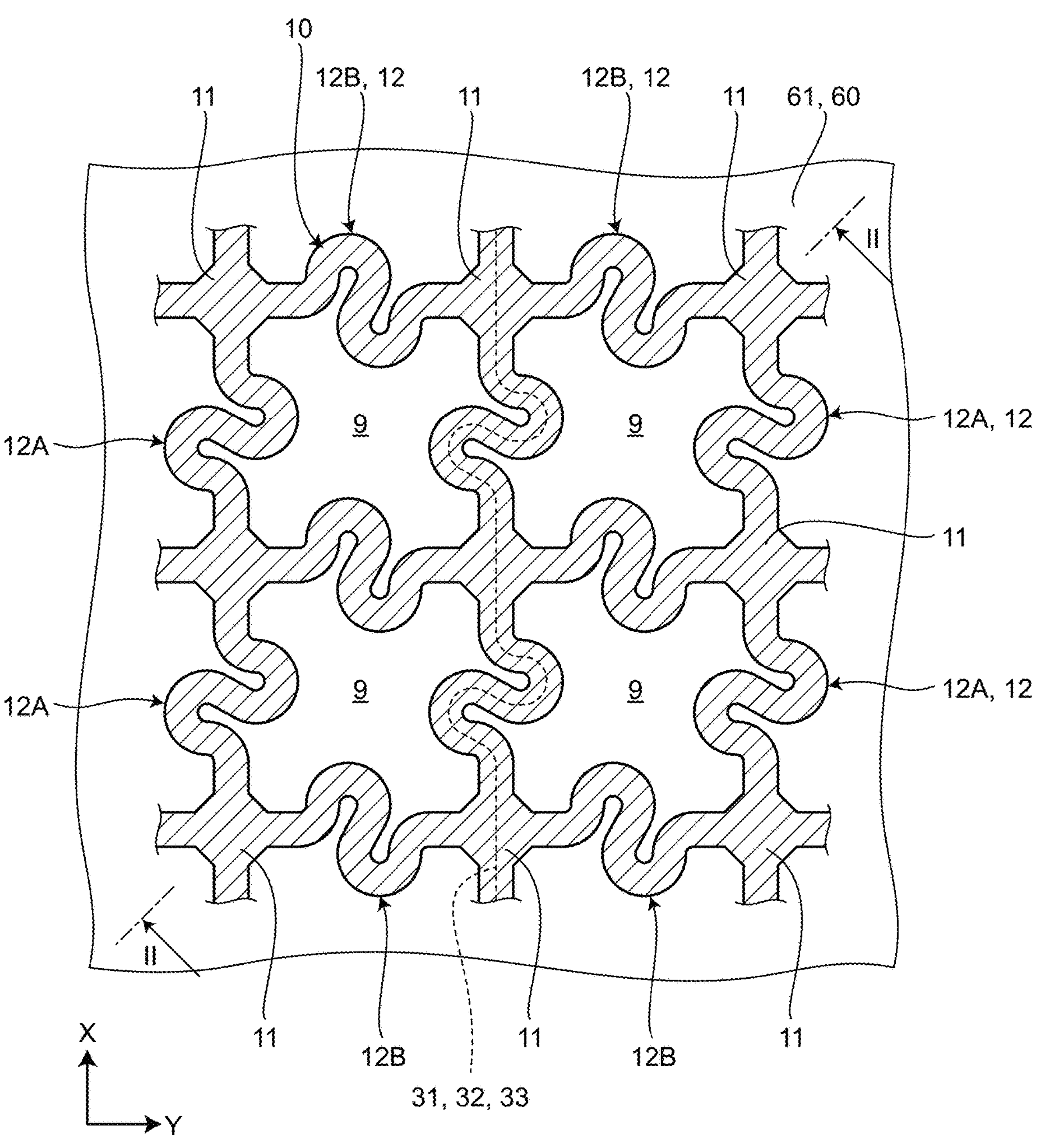
FIG. 3 is a view of part of a resin base member according to the first embodiment when viewed from a first stacking direction.

FIG. 2 is a schematic of a section of the stretchable device according to the first embodiment, and more specifically a sectional view along line II-II of FIG. 3. As illustrated in FIG. 2, the stretchable device 100 includes a first stretchable resin 60, a stretchable substrate 8, and a second stretchable resin 70 stacked in the order as listed. In other words, the stretchable substrate 8 is sandwiched between a pair of stretchable resins (the first stretchable resin 60 and the second stretchable resin 70).

The direction in which the first stretchable resin 60, the stretchable substrate 8, and the second stretchable resin 70 are stacked is hereinafter referred to as a stacking direction. In the stacking direction, the direction in which the second stretchable resin 70 is disposed when viewed from the first stretchable resin 60 is referred to as a first stacking direction Z1, and the direction opposite to the first stacking direction Z1 is referred to as a second stacking direction Z2. The view of the stretchable device 100 from the first stacking direction Z1 is referred to as plan view.

The first stretchable resin 60 and the second stretchable resin 70 have insulating, elastic, and flexible properties. The resin used as the first stretchable resin 60 and the second stretchable resin 70 is acrylic elastomer, for example. The first stretchable resin 60 and the second stretchable resin 70 according to the present disclosure are not limited to acrylic elastomer. They may be acrylic resin, epoxy resin, urethane resin, or the like and are not particularly limited.

The first stretchable resin 60 and the second stretchable resin 70 are formed in a plate shape and extend in the planar direction. The surface of the first stretchable resin 60 in the second stacking direction Z2 serves as the back surface 2 of the stretchable device 100. The first stretchable resin 60 has a stacking surface 61 facing the first stacking direction Z1 and opposed to the stretchable substrate 8.

The surface of the second stretchable resin 70 in the first stacking direction Z1 serves as the front surface 1 of the stretchable device 100. The second stretchable resin 70 has a counter surface 71 facing the second stacking direction Z2 and opposed to the stretchable substrate 8. The ends of the second stretchable resin 70 are provided with a frame part 72 that extends in the second stacking direction Z2 with respect to the counter surface 71.

The frame part 72 is formed in an annular shape in plan view and surrounds the outer periphery of the stretchable substrate 8. A surface 72*a* of the frame part 72 in the second stacking direction Z2 adheres to the stacking surface 61 of the first stretchable resin 60. Therefore, the first stretchable resin 60 and the second stretchable resin 70 cooperate to serve as a housing that accommodates the stretchable substrate 8.

The stretchable substrate 8 has a plurality of through holes 9 passing therethrough in the stacking direction. The second stretchable resin 70 has a plurality of protrusions 73 protruding from the counter surface 71 in the second stacking direction Z2 and disposed in the through holes 9.

While the through hole 9 according to the present embodiment is filled with the second stretchable resin 70 (protrusion 73), the through hole 9 according to the present disclosure may be filled with the first stretchable resin 60. Alternatively, the through hole 9 may be filled with the first stretchable resin 60 and the second stretchable resin 70. Still alternatively, the through hole 9 may be filled with resin other than the first stretchable resin 60 or the second stretchable resin 70. Still alternatively, the through hole 9 may be a space provided with nothing.

The stretchable substrate 8 includes a resin base member 10 stacked on the stacking surface 61 of the first stretchable resin 60, and an array layer 30 stacked on the resin base member 10. The resin base member 10 adheres to the stacking surface 61 of the first stretchable resin 60. The resin base member 10 has elastic, flexible, and insulating properties. The resin base member 10 is made of resin material, such as polyimide.

FIG. 3 is a view of part of the resin base member according to the first embodiment when viewed from the first stacking direction. As illustrated in FIG. 3, the resin base member 10 includes a plurality of bodies 11 and a plurality of hinges 12 meandering and extending in the planar direction.

The body 11 has a quadrilateral (square) shape in plan view. The body 11 is disposed with its four corners facing the first direction X and the second direction Y. The bodies 11 are arrayed in the first direction X and the second direction Y and are separated from one another. The shape of the body 11 according to the present disclosure in plan view is not limited to a quadrilateral shape and may be circular or other polygonal shapes.

The hinge 12 couples the bodies 11 adjacent to each other. The hinges 12 include two kinds of hinges: a longitudinal hinge 12A extending in the first direction X, and a lateral hinge 12B extending in the second direction Y. The part not provided with the bodies 11 or the hinges 12 in the resin base member 10 serves as the through hole 9 passing through the stretchable substrate 8 in the thickness direction.

The array layer 30 includes a plurality of insulating layers stacked in the stacking direction and an electrical circuit provided in the insulating layers, which are not specifically illustrated. Examples of the electrical circuit include, but are not limited to, a strain detecting circuit that detects stretching load in the planar direction of the stretchable device 100, a force detecting circuit that detects force applied to the surface of the stretchable device 100, a light detecting circuit that detects light incident on the stretchable device 100, etc. The type of the electrical circuit according to the present disclosure is not particularly limited.

In this electrical circuit, functional elements, such as transistors, are stacked on the bodies 11. The wiring that supplies signals and electric power to the functional elements is disposed over the bodies 11 and the hinges 12 and extends in the planar direction (refer to wiring lines 31, 32, and 33 in FIG. 3). The array layer 30 according to the present embodiment is provided with three wiring lines 31, 32, and 33 extending in the first direction X.

In the stretchable device 100 with the structure described above, the parts (hinges 12) adjacent to the through holes 9 have low rigidity. When a load in the planar direction acts on the stretchable device 100, the hinges 12 deform. By contrast, the bodies 11 hardly deform, thereby reducing damage to functional elements stacked on the bodies 11.

Figure 4:
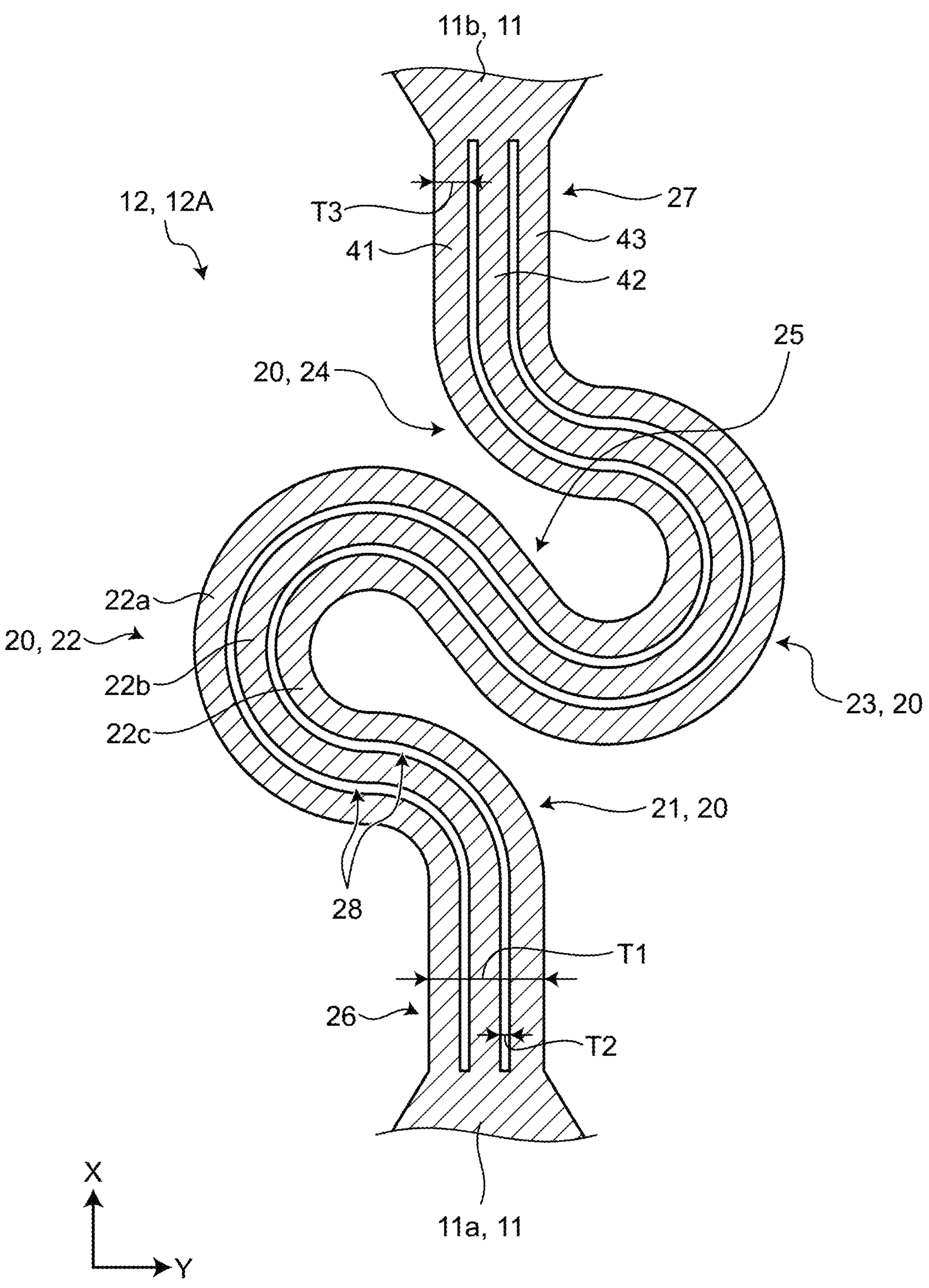
FIG. 4 is a view of a longitudinal hinge according to the first embodiment when viewed from the first stacking direction.

The following describes the hinge of the stretchable substrate 8 in greater detail. FIG. 4 is a view of the longitudinal hinge according to the first embodiment when viewed from the first stacking direction. For the convenience of explanation, one of the two bodies 11 that sandwich the longitudinal hinge 12A is hereinafter referred to as a first body 11*a*, and the other is referred to as a second body 11*b*. The hinge 12 is described in greater detail. When the lateral hinge 12B is rotated by 90 degrees, it has the same shape as that of the longitudinal hinge 12A. Therefore, the longitudinal hinge 12A is described as a representative example, and explanation of the lateral hinge 12B is omitted.

As illustrated in FIG. 4, the longitudinal hinge 12A has bends 20. The longitudinal hinge 12A according to the present embodiment has four bends 20. Therefore, the longitudinal hinge 12A extends in the first direction X while meandering in the second direction Y. Each bend 20 according to the present embodiment has an arc shape in plan view. The length T1 of the longitudinal hinge 12A in the width direction is constant from one end of the longitudinal hinge 12A to the other end. The bend according to the present disclosure does not necessarily have an arc shape and may have an angular shape. The number of bends is not limited to four.

The four bends 20 are a first bend 21, a second bend 22, a third bend 23, and a fourth bend 24 arranged in this order from the first body 11*a* to the second body 11*b*. The first bend 21 and the fourth bend 24 each form a quadrant and are bent at 90 degrees. The second bend 22 and the third bend 23 each form a substantially semi-circular arc and are bent at 180 degrees.

A linear coupling part 25 is provided between the second bend 22 and the third bend 23. A linear first base 26 is provided between the first body 11*a* and the first bend 21. A linear second base 27 is provided between the second body 11*b* and the fourth bend 24. In the following description, the coupling part 25, the first base 26, and the second base 27 may be collectively referred to as linear parts.

The longitudinal hinge 12A has two slits 28 extending along the extending direction of the longitudinal hinge 12A. The slits 28 are not illustrated in the hinges 12 in FIG. 3. While the slit 28 of the hinge 12 according to the present embodiment is formed by etching, the method for forming the slit 28 of the hinge 12 according to the present disclosure is not particularly limited. The slit 28 of the hinge 12 is hereinafter simply referred to as the slit 28.

The slit 28 extends from one end of the longitudinal hinge 12A to the other end. In other words, the entire longitudinal hinge 12A is divided into three parts in the width direction. The width T2 of the slit 28 is constant from one end of the slit 28 to the other end. Thus, the first bend 21, the second bend 22, the third bend 23, the fourth bend 24, the coupling part 25, the first base 26, and the second base 27 are each divided into three parts in the width direction. The three divided parts of the longitudinal hinge 12A are hereafter referred to as divided hinges 41, 42, and 43, respectively. One of the three divided parts of the bend 20 is referred to as a divided bend. The divided hinges 41, 42, and 43 have the same length T3 in the width direction.

Figure 5:
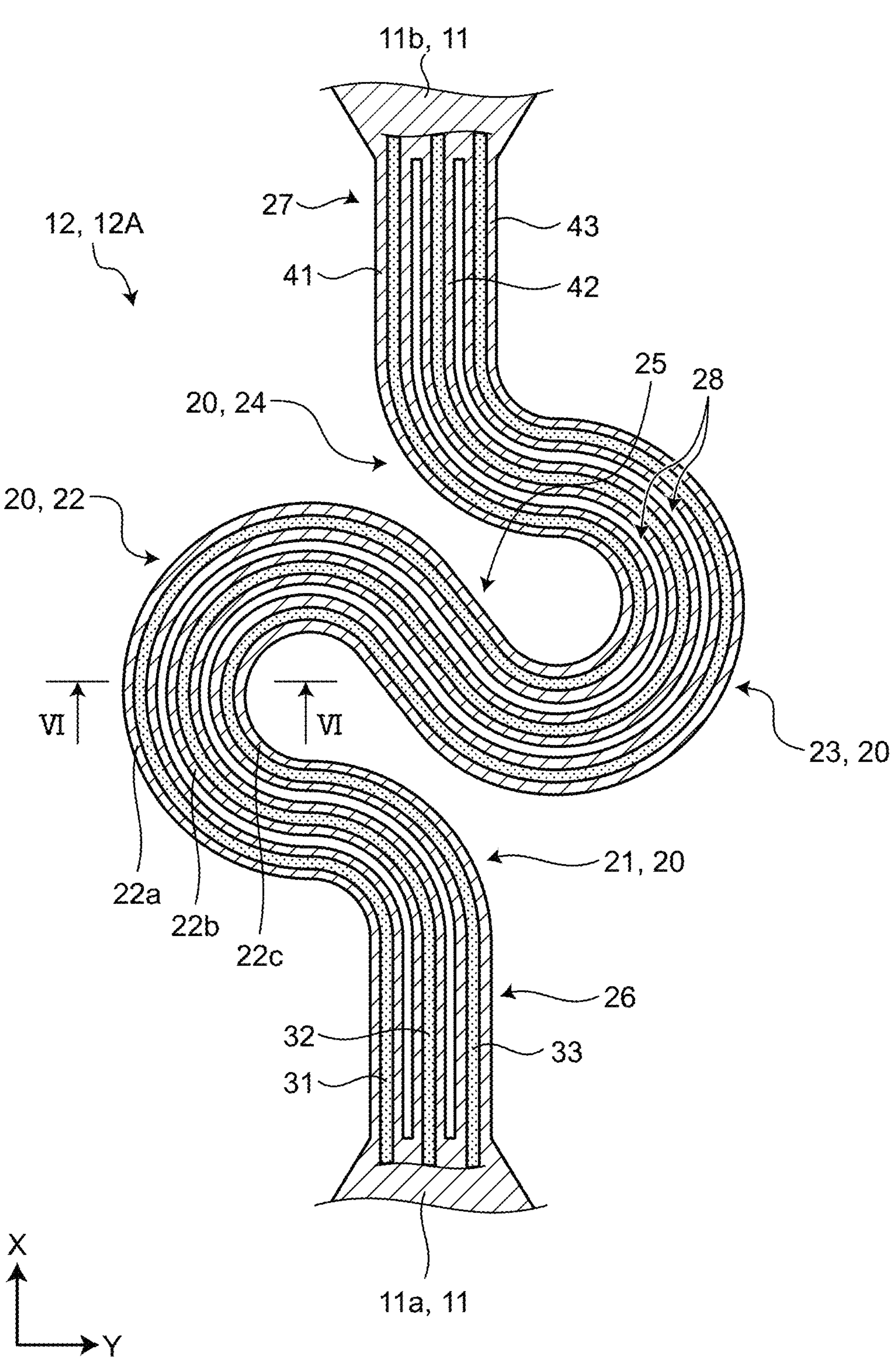
FIG. 5 is a view of the longitudinal hinge and wiring lines according to the first embodiment when viewed from the first stacking direction.

FIG. 5 is a view of the longitudinal hinge and the wiring lines according to the first embodiment when viewed from the first stacking direction. As illustrated in FIG. 5, the wiring lines 31, 32, and 33 of the array layer 30 are disposed apart from each other in the width direction of the longitudinal hinge 12A. The wiring line 31 is disposed on the divided hinge 41. The wiring line 32 is disposed on the divided hinge 42. The wiring line 33 is disposed on the divided hinge 43. Thus, the wiring lines 31, 32, and 33 are separately disposed on the divided hinges 41, 42, and 43, respectively. The slits 28 are formed between the wiring lines 31 and 32 and between the wiring lines 32 and 33 in plan view.

Figure 6:
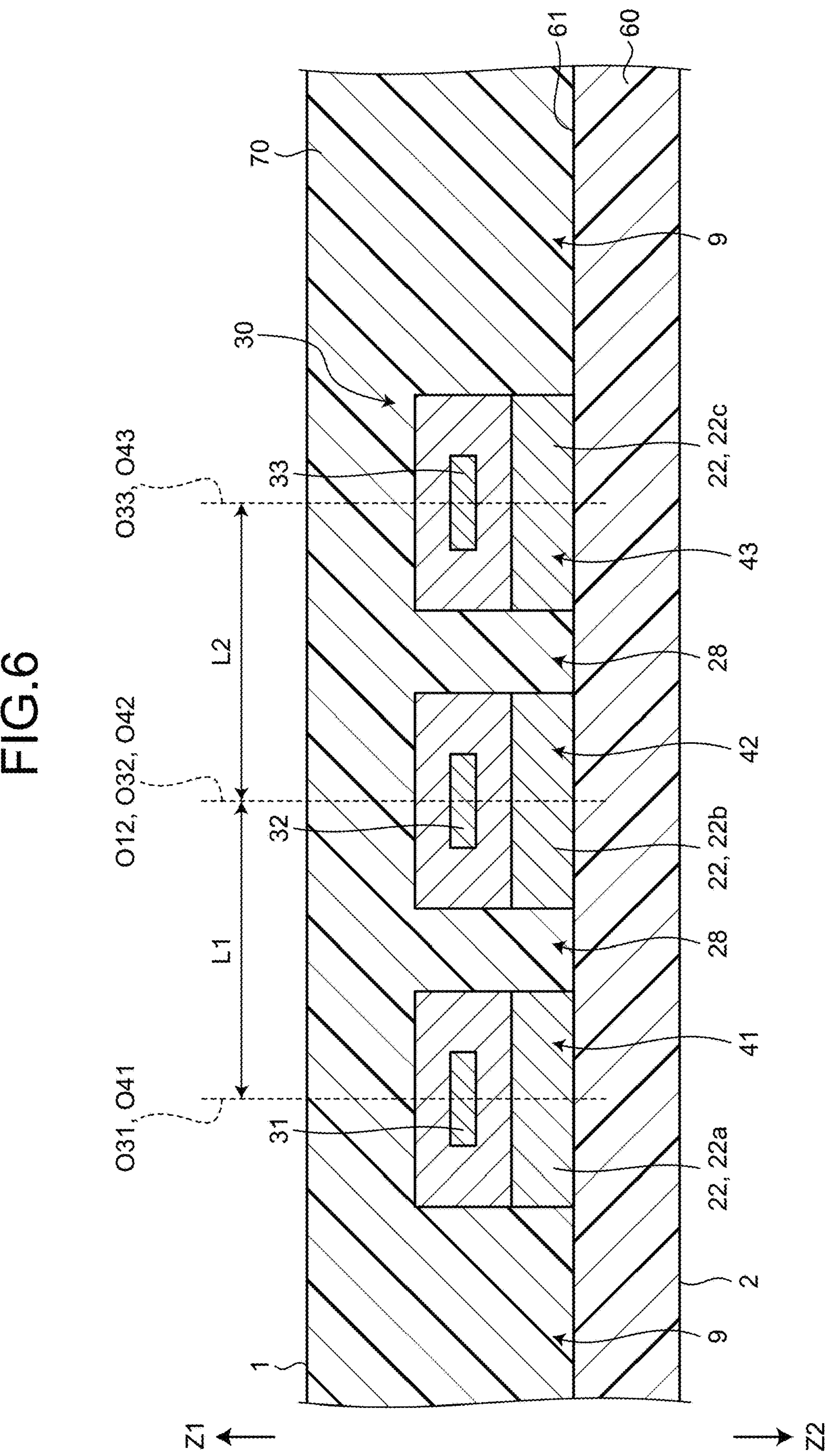
FIG. 6 is a sectional view when viewed from the direction of arrow along line VI-VI of FIG. 5.

FIG. 6 is a sectional view when viewed from the direction of arrow along line VI-VI of FIG. 5. As illustrated in FIG. 6, the center O31 of the wiring line 31 in the width direction overlaps with the center O41 of the divided hinge 41 in the width direction when viewed in the stacking direction. Similarly, the center O32 of the wiring line 32 in the width direction overlaps with the center O42 of the divided hinge 42 in the width direction when viewed in the stacking direction. The centers O32 and O42 overlap with the center O12 of the longitudinal hinge 12A in the width direction when viewed in the stacking direction. The center O33 of the wiring line 33 in the width direction overlaps with the center O43 of the divided hinge 43 in the width direction when viewed in the stacking direction. The slits 28 are provided with the second stretchable resin 70.

The following describes strain generated in the wiring lines 31, 32, and 33 when a load acts on the longitudinal hinge 12A. In this explanation, the load acting on the longitudinal hinge 12A is a tensile load. When a tensile load acts on the longitudinal hinge 12A, the first bend 21, the second bend 22, the third bend 23, and the fourth bend 24 each deform such that the curvature decreases. In other words, similar strain is generated in each of the first bend 21, the second bend 22, the third bend 23, and the fourth bend 24. In the following description, the second bend 22 is described as a representative example, and explanation of the other bends 20 is omitted. The three divided parts of the second bend 22 are referred to as a second outer peripheral divided bend 22*a*, a second intermediate divided bend 22*b*, and a second inner peripheral divided bend 22*c*, respectively (also refer to FIGS. 4 and 5).

First, a configuration in which the slits 28 are not formed is described. If the slits 28 are not formed, the strain generated in the second bend 22 increases away from the center of the second bend 22 in the width direction (center O12 of the longitudinal hinge 12A) toward the inner periphery or the outer periphery. If wiring is disposed near the center O12 of the longitudinal hinge 12A, the strain generated in the wiring decreases. As illustrated in FIG. 6, the wiring line 31 is positioned on the outer periphery side with respect to the center O12 of the longitudinal hinge 12A and is separated from the center O12 by a distance L1. The wiring line 33 is positioned on the inner periphery side with respect to the center O12 of the longitudinal hinge 12A and is separated from the center O12 by a distance L2. Therefore, if the slits 28 are not formed, more strain is generated in the wiring lines 31 and 33, and less strain is generated in the wiring line 32.

By contrast, the strain generated in the second outer peripheral divided bend 22*a* according to the present embodiment increases away from the center of the second outer peripheral divided bend 22*a* in the width direction (center O41 of the divided hinge 41 in the width direction) toward the inner periphery or the outer periphery. The strain generated in the second intermediate divided bend 22*b* increases away from the center of the second intermediate divided bend 22*b* in the width direction (center O42 of the divided hinge 42 in the width direction) toward the inner periphery or the outer periphery. The strain generated in the second inner peripheral divided bend 22*c* increases away from the center of the second inner peripheral divided bend 22*c* in the width direction (center O43 of the divided hinge 43 in the width direction) toward the inner periphery or the outer periphery.

The center O31 of the wiring line 31 in the width direction overlaps with the center of the second outer peripheral divided bend 22*a* in the width direction (center O41 of the divided hinge 41 in the width direction) when viewed in the stacking direction. The center O32 of the wiring line 32 in the width direction overlaps with the center of the second intermediate divided bend 22$b$ in the width direction (center O42 of the divided hinge 42 in the width direction) when viewed in the stacking direction. The center O33 of the wiring line 33 overlaps with the center of the second inner peripheral divided bend 22$c$ (center O43 of the divided hinge 43 in the width direction) when viewed in the stacking direction. Therefore, the amount of strain generated in the wiring lines 31 and 33 is smaller than that generated when the slits 28 are not formed. The amount of strain generated in the wiring line 32 is as small as that generated when the slits 28 are not formed.

As described above, the present embodiment decreases the strain generated in the wiring lines 31 and 33 disposed at parts other than the center O12 of the hinge 12 in the width direction, thereby making the wiring lines 31 and 33 less likely to be broken. In addition, when a load acts on the longitudinal hinge 12A, the amount of strain generated in the coupling part 25, the first base 26, and the second base 27 is significantly small. Therefore, the probability of the wiring lines 31, 32, and 33 being broken at the linear parts (the coupling part 25, the first base 26, and the second base 27) is significantly low.

While the first embodiment has been described above, the present disclosure is not limited thereto. While the present embodiment has three wiring lines and two slits 28, for example, the present disclosure may have two wiring lines and one slit 28. Alternatively, the present disclosure may have four wiring lines and three slits 28. Thus, the numbers of wiring lines and slits according to the present disclosure are not particularly limited.

While the centers O31, O32, and O33 of the wiring lines 31, 32, and 33 in the width direction according to the present embodiment overlap with the centers O41, O42, and O43 of the divided hinges 41, 42, and 43 in the width direction when viewed in the stacking direction, the centers O31, O32, and O33 according to the present disclosure may be shifted in the width direction.

Figure 7:
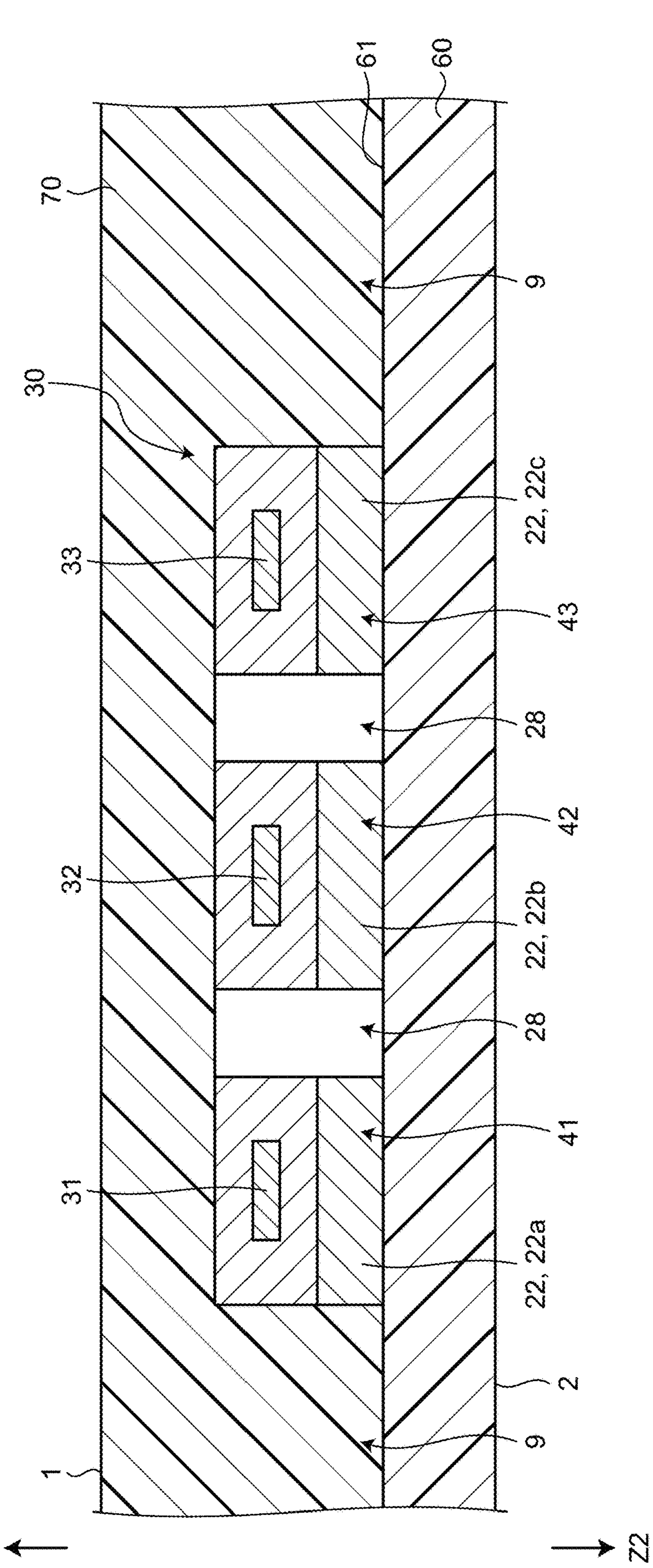
FIG. 7 is a plan view of the longitudinal hinge according to a first modification.

FIG. 7 is a plan view of the longitudinal hinge according to a first modification. As illustrated in FIG. 7, the slits 28 according to the present disclosure are not necessarily provided with the stretchable resin (second stretchable resin 70). In other words, the slit 28 may be a space.

Figure 8:
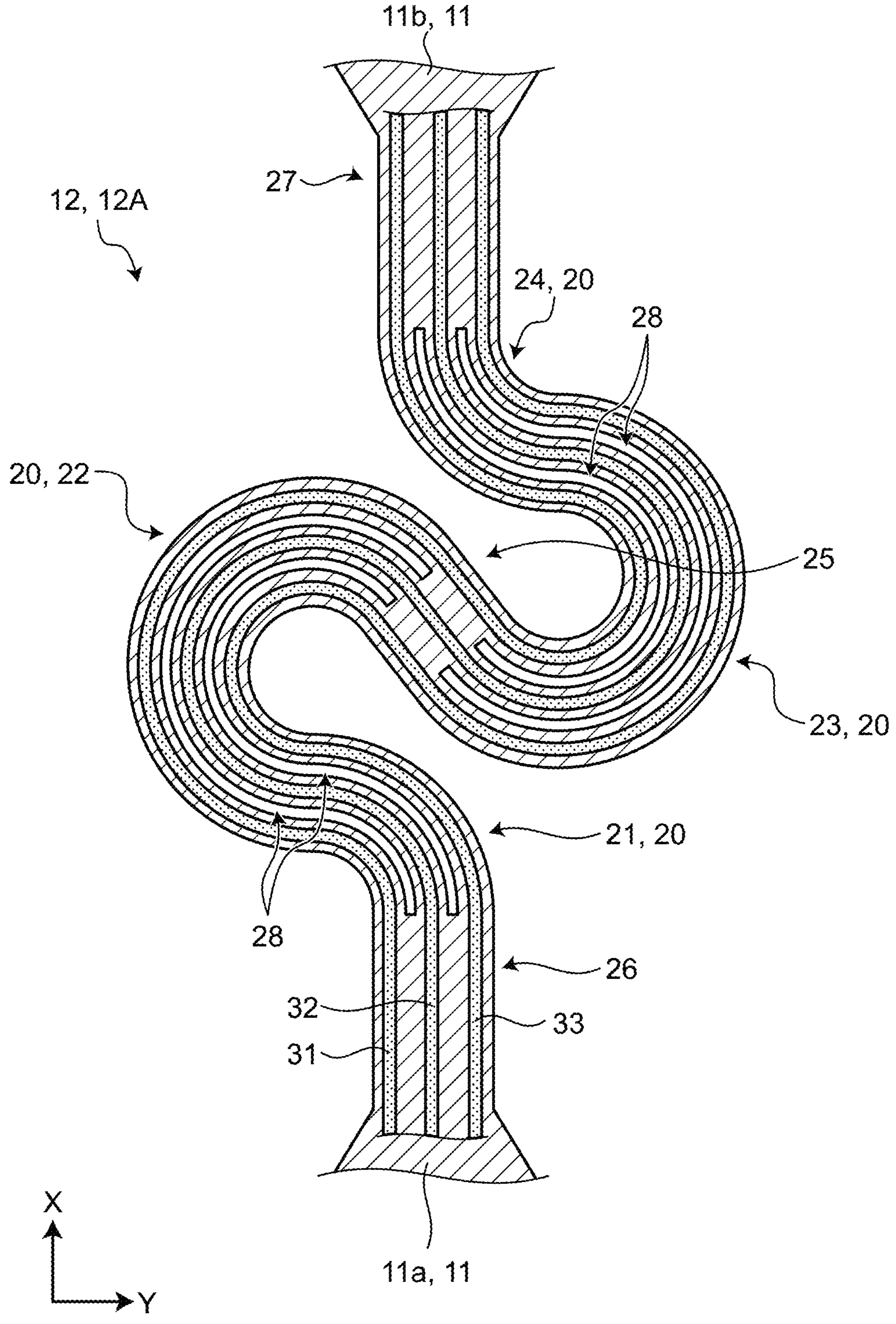
FIG. 8 is a plan view of the longitudinal hinge and the wiring lines according to a second modification.

While the slit 28 according to the first embodiment extends from one end of the hinge to the other end, the slit 28 according to the present disclosure simply needs to be formed in the bend 20. FIG. 8 is a plan view of the longitudinal hinge and the wiring lines according to a second modification. Specifically, as in the second modification illustrated in FIG. 8, the slits 28 are not necessarily formed in the coupling part 25, the first base 26, and the second base 27. In other words, the linear parts (the coupling part 25, the first base 26, and the second base 27) according to the second modification are continuous in the width direction. In the first modification illustrated in FIG. 7, the slits 28 are not provided with the stretchable resin (second stretchable resin 70), and thus the divided bends (the second outer peripheral divided bend 22$a$, the second intermediate divided bend 22$b$, and the second inner peripheral divided bend 22$c$) may possibly interfere with each other. By contrast, the second modification can reduce interference between the divided bends.

The widths of the wiring lines and the slits according to the present disclosure are not necessarily constant in the extending direction of the hinge. The following describes a third modification where the widths of the wiring lines and the slits are not constant.

Figure 9:
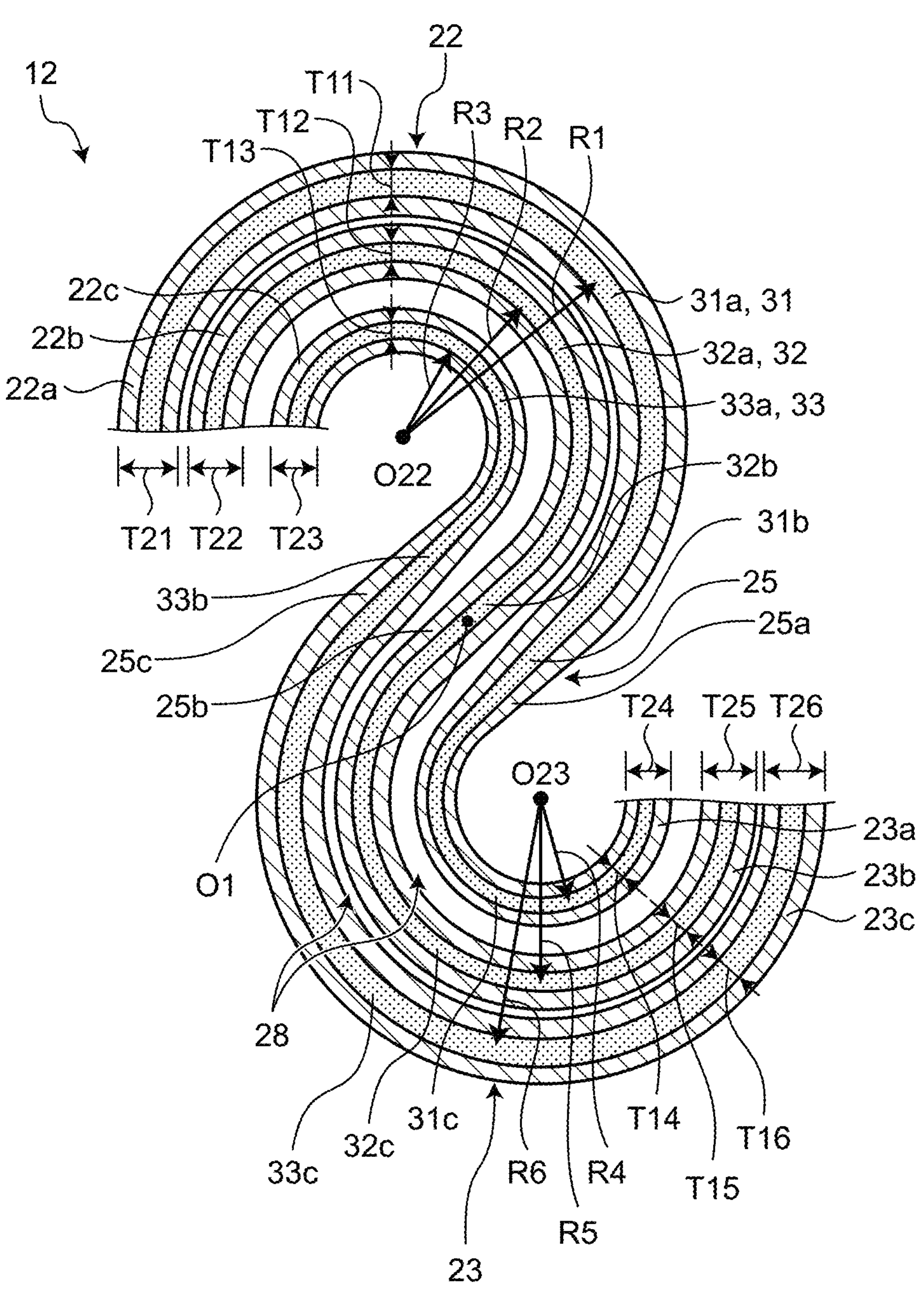
FIG. 9 is a view of the longitudinal hinge on which a wiring layer is stacked according to a third modification when viewed from the first stacking direction.

FIG. 9 is a view of the longitudinal hinge on which a wiring layer is stacked according to the third modification when viewed from the first stacking direction. As illustrated in FIG. 9, in the third modification, only the second bend 22, the coupling part 25, and the third bend 23 of the hinge 12 are described. The second bend 22 of the hinge 12 according to the third modification includes the second outer peripheral divided bend 22$a$, the second intermediate divided bend 22$b$, and the second inner peripheral divided bend 22$c$. The coupling part 25 includes a first coupling part 25$a$, a second coupling part 25$b$, and a third coupling part 25$c$. The third bend 23 includes a third inner peripheral divided bend 23$a$, a third intermediate divided bend 23$b$, and a third outer peripheral divided bend 23$c$.

The wiring line 31 has an arc wiring portion 31$a$ provided to the second outer peripheral divided bend 22$a$, a partial wiring line 31$b$ provided to the first coupling part 25$a$, and an arc wiring portion 31$c$ provided to the third inner peripheral divided bend 23$a$. The wiring line 32 has an arc wiring portion 32$a$ stacked on the second intermediate divided bend 22$b$, a partial wiring line 32$b$ stacked on the second coupling part 25$b$, and an arc wiring portion 32$c$ stacked on the third intermediate divided bend 23$b$. The wiring line 33 has an arc wiring portion 33$a$ stacked on the second inner peripheral divided bend 22$c$, a partial wiring line 33$b$ stacked on the third coupling part 25$c$, and an arc wiring portion 33$c$ stacked on the third outer peripheral divided bend 23$c$.

The radii of curvature R1, R2, and R3 of the arc wiring portions 31$a$, 32$a$, and 33$a$ are 340, 320, and 300, respectively, and the radius of curvature is larger as closer to the outer periphery side. The widths T11, T12, and T13 of the arc wiring portions 31$a$, 32$a$, and 33$a$ are 10.6, 10.0, and 9.4, respectively, and the width is larger as closer to the outer periphery side.

The electrical resistance of wiring line is calculated by Electrical Resistivity×Length of Wiring line÷Cross-Sectional Area of Wiring line. The arc wiring portions 31$a$, 32$a$, and 33$a$ are made of the same material and have the same electrical resistivity. The arc wiring portions 31$a$, 32$a$, and 33$a$ have a substantially semi-circular shape (180°) centered at a virtual point O22. Therefore, the lengths of the arc wiring portions 31$a$, 32$a$, and 33$a$ are πR1, πR2, and πR3; and the radii of curvature of the arc wiring portions 31$a$, 32$a$, and 33$a$ are different from each other. In the cross-sectional areas of the arc wiring portions 31$a$, 32$a$, and 33$a$, the thicknesses in the stacking direction are the same, but the widths are different from each other.

Therefore, the relative relation between the resistances of the arc wiring portions 31$a$, 32$a$, and 33$a$ is R1/T11: R2/T12: R3/T13. In other words, the relative relation between the resistances of the arc wiring portions 31$a$, 32$a$, and 33$a$ is calculated by dividing the radii of curvature of the arc wiring portions 31$a$, 32$a$, and 33$a$ by the widths of the arc wiring portions 31$a$, 32$a$, and 33$a$, respectively.

In the present embodiment, the value obtained by dividing the radius of curvature of each of the arc wiring portions 31$a$, 32$a$, and 33$a$ by the width is "32". In other words, the relative relation between the resistances of the arc wiring portions 31$a$, 32$a$, and 33$a$ is 32:32:32. Thus, the resistances of the arc wiring portions 31$a$, 32$a$, and 33$a$ according to the present embodiment are the same value. Therefore, when the second bend 22 does not deform, the electrical characteristics of the arc wiring portions 31$a$, 32$a$, and 33$a$ are the same.

The width of the partial wiring line 31*b* decreases as distance from the arc wiring portion 31*c* decreases, and the width T14 of the arc wiring portion 31*c* is 9.4. The width T15 of the partial wiring line 32*b* and the arc wiring portion 32*c* is 10.0, which is equal to the width T12 of the arc wiring portion 32*a*. The width of the partial wiring line 33*b* increases as distance from the arc wiring portion 33*c* decreases, and the width T16 of the arc wiring portion 33*c* is 10.6. In other words, the wiring lines 31, 32, and 33 are point-symmetrical about a point O1. Therefore, the relative relation between the resistances of the arc wiring portions 31*c*, 32*c*, and 33*c* is also 32:32:32. Thus, the resistances of the arc wiring portions 31*c*, 32*c*, and 33*c* are the same value. Therefore, when the third bend 23 does not deform, the electrical characteristics of the arc wiring portions 31*c*, 32*c*, and 33*c* are the same.

As described above, it is possible to give the same electrical characteristics to the wiring lines 31, 32, and 33 in the area overlapping the second bend 22, the coupling part 25, and the third bend 23.

The widths of the second outer peripheral divided bend 22*a*, the second intermediate divided bend 22*b*, and the second inner peripheral divided bend 22*c* are T21, T22, and T23, respectively. The radii of curvature of the second outer peripheral divided bend 22*a*, the second intermediate divided bend 22*b*, and the second inner peripheral divided bend 22*c* are R1, R2, and R3, which are equal to those of the arc wiring portions 31*a*, 32*a*, and 33*a*. The values obtained by dividing the radii of curvature by the widths are equal to one another ((R1/T21)=(R2/T22)=(R3/T23)). Therefore, the stretching ratios of the second outer peripheral divided bend 22*a*, the second intermediate divided bend 22*b*, and the second inner peripheral divided bend 22*c* are equal to one another.

Similarly, in the third inner peripheral divided bend 23*a*, the third intermediate divided bend 23*b*, and the third outer peripheral divided bend 23*c*, the values obtained by dividing the radii of curvature R4, R5, and R6 by the widths T24, T25, and T26 are equal to one another ((R4/T24)=(R5/T25)=(R6/T26)). Therefore, the stretching ratios of the third inner peripheral divided bend 23*a*, the third intermediate divided bend 23*b*, and the third outer peripheral divided bend 23*c* are equal to one another.

What is claimed is:

1. A stretchable device comprising:

a resin base member comprising a plurality of bodies disposed apart from each other and a plurality of hinges that couple the bodies to each other; and an array layer provided on the resin base member, wherein the array layer comprises a plurality of wiring lines extending along the hinges and spaced apart from each other in a width direction of the hinges, each of the hinges has a plurality of bends bending when viewed in a stacking direction in which the resin base member and the array layer are stacked, and each of the bends has at least one or more slits that are formed between the wiring lines when viewed in the stacking direction and that divide the bend in the width direction, wherein the hinge has a linear part having a linear shape when viewed in the stacking direction, and the linear part does not have the at least one or more slits and is continuous in the width direction.

2. The stretchable device according to claim 1, wherein the bend has a plurality of divided bends divided in the width direction by the at least one or more slits, and the wiring lines are respectively disposed at centers of the divided bends in the width direction.

3. The stretchable device according to claim 1, wherein the bend has a plurality of divided bends divided in the width direction by the at least one or more slits, the bend is an arc-shaped bend when viewed in the stacking direction, the divided bends have different radii of curvature, the wiring lines have arc wiring portions disposed on the divided bends and having different radii of curvature from each other, and values of the arc wiring portions obtained by dividing the radii of curvature of the arc wiring portions by the widths of the arc wiring portion are equal to each other.

4. The stretchable device according to claim 2, wherein the bend has a plurality of divided bends divided in the width direction by the at least one or more slits, the bend is an arc-shaped bend when viewed in the stacking direction, the divided bends have different radii of curvature, the wiring lines have arc wiring portions disposed on the divided bends and having different radii of curvature from each other, and values of the arc wiring portions obtained by dividing the radii of curvature of the arc wiring portions by the widths of the arc wiring portion are equal to each other.

* * * * *